United States Patent [19]

Rosnowski

[11] 4,099,997

[45] Jul. 11, 1978

[54] METHOD OF FABRICATING A SEMICONDUCTOR DEVICE

[75] Inventor: Wojciech Rosnowski, Summit, N.J.

[73] Assignee: RCA Corporation, New York, N.Y.

[21] Appl. No.: 698,480

[22] Filed: Jun. 21, 1976

[51] Int. Cl.² .................. H01L 21/225; H01L 21/223
[52] U.S. Cl. .................... 148/187; 148/188; 148/189; 148/190; 427/85
[58] Field of Search ............. 27/576 R, 576 T, 612; 148/188, 190, 187, 189; 427/85

[56] References Cited

U.S. PATENT DOCUMENTS

| | | | |
|---|---|---|---|
| 3,313,012 | 4/1967 | Long | 29/25.3 |
| 3,523,042 | 8/1970 | Bower | 148/1.5 |
| 3,615,945 | 10/1971 | Yokozawa | 148/190 |
| 3,649,387 | 3/1972 | Frentz et al. | 148/187 |
| 3,748,198 | 7/1973 | Basi et al. | 148/190 |
| 3,886,569 | 5/1975 | Basi et al. | 357/54 |
| 3,901,735 | 8/1975 | Dunkley | 148/1.5 |
| 3,925,121 | 12/1975 | Touchy | 148/189 |
| 4,040,878 | 8/1977 | Rowe | 148/188 |

FOREIGN PATENT DOCUMENTS 1,068,392  5/1967  United Kingdom ............ 148/190

*Primary Examiner*—John T. Goolkasian
*Attorney, Agent, or Firm*—H. Christoffersen; R. P. Williams; R. A. Hays

[57] ABSTRACT

A method of fabricating a semiconductor device having a one type conductivity portion substantially surrounded by a second type conductivity portion is disclosed. The method involves selectively diffusing different impurities having the same conductivity inducing effect. The disclosed method is particularly adaptable to forming a plurality of devices in a relatively thick semiconductor wafer.

14 Claims, 6 Drawing Figures

METHOD OF FABRICATING A SEMICONDUCTOR DEVICE

The present method relates, in general, to the fabrication of semiconductor devices and, in particular, relates to the fabrication of thyristor devices.

Conventional thyristor devices are generally comprised of four layers of semiconductor material having alternating conductivity types and three PN junctions therebetween. When a plurality of such devices are formed on a single semiconductor wafer at least two of the PN junctions usually extend laterally across the entire wafer. These two PN junctions must be passivated or protected in some manner so that the PN junctions are reliable and stable after device separation.

One known method for providing such passivation is to etch moats in the wafer, usually opposing each other for efficient use of wafer area, around each of the plurality of devices to a depth such that the PN junctions are exposed. The moats are then refilled with a known passivating material. The devices are then separated at a plane other than the plane through the moats so that the passivating material is not disturbed during the separation process. This method has a severe drawback in that after the moats are formed the wafer is structurally very fragile. That is, since the thickness of the wafer between opposing moats is very much reduced, the wafer tends to fracture during the normal handling thereof.

A method of fabricating a plurality of thyristor devices on a single wafer which substantially avoids the fracture problem includes forming a moat around each device on only one side of the wafer. The moat is made to extend to a depth such that only one of the two PN junctions is exposed. Thereafter, impurities, usually boron atoms, are diffused into the wafer to form a region through the remainder of the wafer beneath the moat. The moat is then refilled with material which passivates the exposed PN junction. The devices are then separated at a plane other than the plane through the moat. In this method, the second of the two PN junctions discussed above need not be specially passivated since it, due to the diffused region, does not terminate in the plane of separation. This method, however, has the drawback that, since the wafer is usually silicon, dislocations are formed in the wafer. These dislocations are generally caused by the lattice mismatch between the boron atoms and the silicon atoms. These dislocations have disruptive effects upon the operation of a device. For example, such dislocations can result in increased leakage currents which can cause a junction breakdown at potentials as low as about 200 V. In general, dislocations also cause decreased product yields.

It is desirable, in light of the above discussion, that there is a need to provide a method which not only allows a plurality of thyristor devices to be formed in a semiconductor wafer but one which also yields a physically stronger wafer and a comparatively high voltage device.

Figure 1:
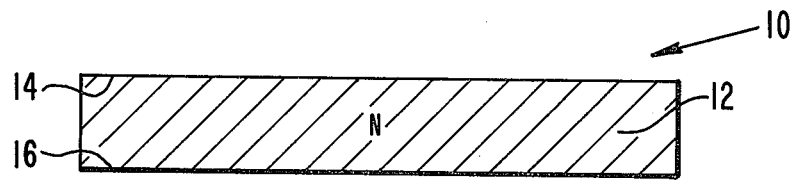
FIGS. 1 through 5 are cross-sectional views of a semiconductor thyristor device at various stages of the present novel method, not drawn to scale.

The initial workpiece in the present method of fabricating a semiconductor device, such a device being indicated generally at 10 in the drawings, is, as shown in FIG. 1, a body of semiconductor material. Preferably the body material is silicon. The body is preferably in the form of a wafer 12 having two substantially parallel major opposing surfaces 14 and 16. While the wafer 12 can be any size available in the semiconductor industry it is preferred that the wafer 12 have a diameter of about 5.1 centimeters and a thickness of about 200 micrometers. The wafer 12 has an initial resistivity of between about 25 ohm-cm and 45 ohm-cm. Thus, the average impurity concentration in the wafer 12 is between from about $2.1 \times 10^{14}$ atoms/cm$^3$ to about $1.0 \times 10^{14}$ atoms/cm$^3$. Preferably the impurities therein are such as to make the wafer 12 have a slight N-type conductivity (donors), although impurities creating a slight P-type conductivity (acceptors) can also be used so long as all other conductivity types are likewise changed.

Figure 2:
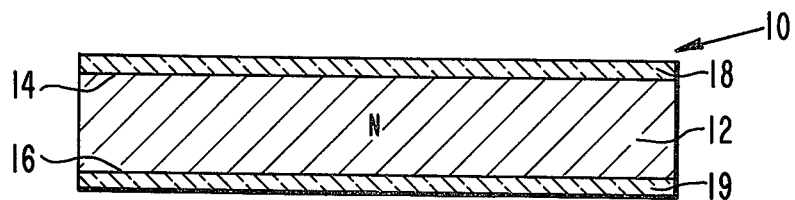

Referring to FIG. 2, layers 18 and 19 of insulating material containing, in this case, first acceptor type impurities, are formed on the two surfaces 14 and 16 of the wafer 12, respectively. Boron, as known in the art, is a commonly used acceptor type impurity and the layers 18 and 19 may be borosilicate glass, for example. The borosilicate glass can be formed using known chemical vapor deposition techniques and a combination of silane (SiH$_4$), diborane (B$_2$H$_6$), oxygen (O$_2$) and nitrogen (N$_2$) as the reacting gases. Preferably the silane and diborane are in such proportion that the resulting borosilicate glass contains between about 17% and about 20% boron by weight. Preferably the deposition of each of the layers 18 and 19 is carried out until the respective layers 18 and 19 is on the order of about 6000 Å thick.

Figure 3:
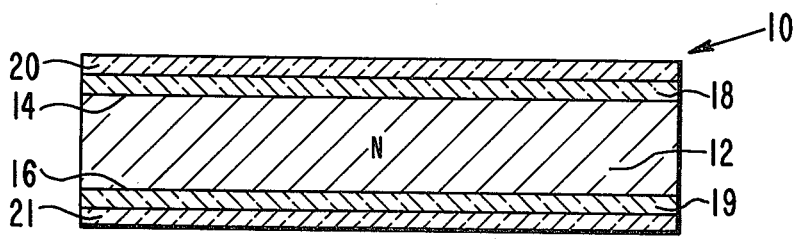

As shown in FIG. 3, layers 20 and 21 of masking material are formed on the borosilicate glass layers 18 and 19, respectively. The layers 20 and 21 of masking material can each be, for example, a chemically vapor deposited layer of silicon dioxide which has a thickness of between from about 30,000 Å to about 35,000 Å or each may be a layer of silicon nitride which has a thickness on the order of about 2,000 Å, or the like. If chemically vapor deposited silicon dioxide is used, it is preferred that the wafer 12 be annealed after the formation thereof. The annealing preferably takes place by heating the wafer 12 at about 900° C. for about 30 minutes. The annealing procedure densifies the silicon dioxide so that it is less permeable to any subsequent impurity diffusions.

Figure 4:
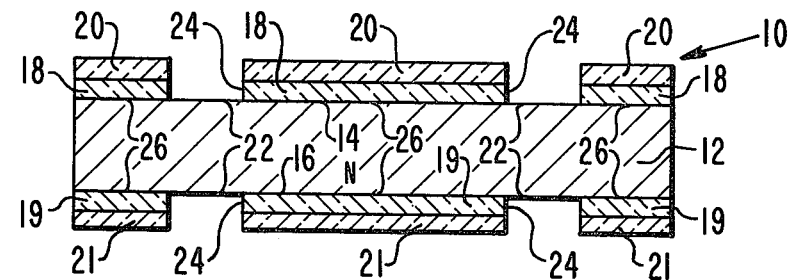

Referring now to FIG. 4, it is shown that preselected portions 22 of the two surfaces 14 and 16 are next exposed through openings 24 in the layers 18, 20 and 19, 21, respectively. The openings 24 are formed by using known masking and photolithographic techniques and employing known etchants. Preferably, for reasons which will become apparent, when a thyristor device is fabricated, the openings 24 on each of the surfaces 14 and 16 are oppositely aligned.

The wafer 12, having the previously exposed portions 22 of the surfaces 14 and 16, is next exposed to a source of impurities of the same conductivity determining type as the impurities in the layers 18 and 19; in this case, acceptor type impurities. These second impurities should be a species which has a comparatively more rapid diffusion rate (diffusivity) than the first impurities in the layers 18 and 19. Preferably, the second impurity is aluminum which has a diffusivity in silicon of about three times that of boron. The aluminum impurities can be diffused into the wafer 12 by the use of any known method. The aluminum impurities penetrate the surface 14 and 16 through the openings 24; the remaining layers 20 and 21 of silicon dioxide, in conjunction with the layers 18 and 19 of borosilicate glass, mask the unexposed portions 26 of the surfaces 14 and 16 from the aluminum impurities. The wafer 12 is then cooled in a conventional manner. Preferably at this point there exists a surface concentration of aluminum impurities greater than about $1 \times 10^{18}$ atoms/cm$^3$ which penetrates into the wafer 12 beneath the exposed positions 22 to a depth of about 12 micrometers. Due to the heating of the wafer 12 during the diffusion process some of the boron from the layers 18 and 19 has been driven into the wafer 12 and therefore there also exists, at this point, a surface concentration of boron impurities of about $1 \times 10^{18}$ atoms/cm$^3$ which penetrates into the wafer 12 beneath the unexposed portions 26 to a depth of about 3 micrometers.

While the use of borosilicate glass layers, 18 and 19, has been described as a method of providing a surface concentration of boron impurities beneath the unexposed portions 26 the present method is not intended to be limited thereto. For example, boron impurities may be provided by ion implantation prior to the formation of the layers of masking material, 20 and 21. The preferred surface concentration of boron impurities is obtainable using known ion implantation techniques. The layers of masking materials 20 and 21, are, if ion implantation is used only for forming the source of boron impurities, made comparatively thicker in order to compensate for the reduced aluminum masking due to the absence of the layers, 18 and 19, of borosilicate glass. Alternatively the need for layers of masking material 20 and 21 can be substantially eliminated if the source of aluminum impurities is also formed by ion implantation. The above-described method utilizing the borosilicate glass and the layer of masking material is presently preferred because of the comparatively higher cost of ion implantation techniques.

Figure 5:
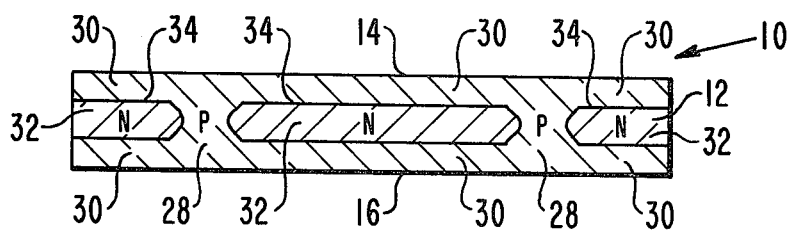
Figure 6:
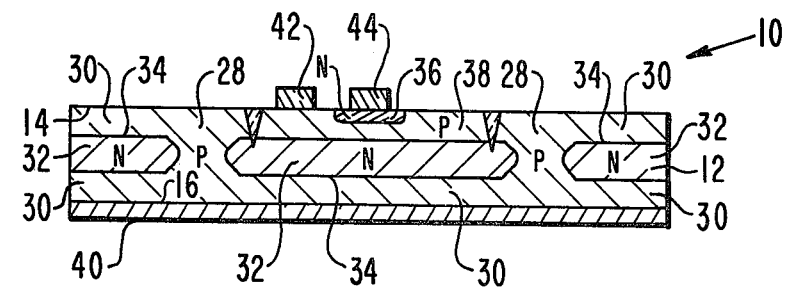
FIG. 6 is a cross-sectional view of a substantially completed device made by using the present novel method, not drawn to scale.

In the present method, the remaining silicon dioxide and borosilicate glass is next removed using methods known in the art. The wafer 12 is then heated to a temperature at which the first impurities and the second impurities are driven further thereinto. The wafer 12 remains at this temperature for a time which is long enough so that the second impurities penetrate through wafer 12 and form a continuous region 28 between the surfaces 14 and 16, as shown in FIG. 5. In the present example, the wafer 12 is heated to between from about 1200° C to about 1300° C and maintained at those temperatures for between from about 140 hours to about 20 hours respectively. This is a much shorter time than if boron, or an impurity having a comparatively lower diffusivity, were used to form the region 28. Further, the concentration of the aluminum, at about half way through the wafer 12, is on the order of about $2 \times 10^{15}$ atoms/cm$^3$, which, for the temperatures and times stated, is comparatively greater than if a comparatively lower diffusion rate material were used. This results in comparatively better passivation for the device, in this example, a thyristor. During the above-described drive-in procedure the boron impurities penetrate to a depth, from each surface 14 and 16, of about 40 micrometers and form another continuous region 30 beneath the surfaces between the regions 28.

As a result of the drive-in a plurality of segments 32 of the original wafer 12 are created. The segments 32 are, in this case, comprised of that material of the wafer 12 which has remained at substantially the same conductivity type and concentration throughout the above-described steps and are substantially surrounded by the continuous regions 28 and 30. A plurality of PN junctions 34 are between the segments 32 and the surrounding regions, 28 and 30.

At this stage, the steps of the present novel method are substantially completed. A plurality of four layer NPNP semiconductor devices 10, for example thyristors, may be made from the wafer as processed thus far by the following steps. 1. Forming N-type cathode regions 36 in the continuous regions 30, which constitute, in this example, gate regions 38. This forming step can be carried out using known semiconductor techniques. 2. Electrically separating the gate regions 38 from the continuous regions 28 and 30 using known methods, such as moat etching and refill techniques. This separation step should be such that the exposed portions of the PN junctions 34 are passivated upon refilling the moats, i.e. the moats are refilled with a passivating material. At this stage of fabrication the remaining electrically continuous regions 28 and 30 constitute, in this case, the anode regions of the thyristor. Further, the segments 32 constitute the base region of each of the thyristors. 3. First, second and third terminal means, 40, 42, and 44 respectively, may be fabricated using known techniques. In this example, the first, second, and third terminal means 40, 42, and 44, respectively, constitute the anode, gate and cathode electrodes. 4. Finally the wafer 12 is separated by known methods along planes which pass through the continuous regions 28.

As discussed above, the openings 24 are preferably formed in opposition on the surfaces 14 and 16. If the wafer 12 were comparatively thinner, for example on the order of about 150 micrometers, it would then be feasible to form the continuous region 28 by exposing portions 22 on only one surface 14 of the wafer 12. However, the diffusion time would be increased and thus the wafer would be subjected to the comparatively high diffusion temperature for that longer time. This is undesirable since any exposure to comparatively high temperatures may contaminate the wafer 12 and the longer the wafer 12 is exposed to the diffusion ambient the greater are the possibilities of damaging that wafer 12. Further, if the continuous region 28 is formed by diffusion from only one surface the resulting impurity concentration at the opposing surface is less than in the above discussed method, thus providing less junction passivation.

The use of aluminum as the second impurity for forming the continuous region 28 has the further advantage, even though it is considered difficult to mask, in that aluminum has a comparatively low lattice mismatch with silicon. For example, boron, the most commonly used P-type dopant, has a lattice mismatch on the order of about 25% while aluminum has a lattice mismatch on the order of about 7%. The lattice mismatch is a comparative measure of the atomic size of two materials. Hence, for example, since boron has a lattice mismatch of 25% with respect to silicon and aluminum has a silicon lattice mismatch of only 7%, one atom of boron introduced into a body of silicon causes more atomic disturbance than one atom of aluminum. Thus, by using aluminum instead of boron as the second impurity to form the continuous region 28, the continuous region 28 is physically less disrupted and thereby provides better electrical passivation for the device 10.

What is claimed is:

1. A method of fabricating a semiconductor device comprising the steps of:

forming a source of first impurities of one conductivity determining type on each of two major opposing surfaces of a semiconductor wafer, said wafer containing opposite type determining impurities;

disposing a layer of masking material over said source of first impurities;

defining said layer and said source of first impurities to expose preselected portions of said surfaces;

exposing said wafer to a source of second impurities of said one conductivity determining type in such a manner that said second impurities diffuse into said wafer through said preselected portions, said first impurities simultaneously penetrating said unexposed portions of said wafer, said second impurities being masked from the unexposed portions of said surfaces by said source of first impurities and said masking layer, said second impurities having a comparatively higher diffusivity in said wafer than said first impurities; and thereafter removing said masking layer and said source of first impurities; and thereafter heating said wafer to a temperature at which said first impurities and said second impurities further penetrate said wafer for a time long enough so that said second impurities form first continuous regions between said two opposing surfaces.

2. The method as claimed in claim 1 wherein:
said first impurities form second continuous regions between said first continuous regions.

3. A method as claimed in claim 1 wherein said step of forming said source of first impurities comprises:
forming a first layer of material containing said first impurities on each of two major opposing surfaces of a semiconductor wafer.

4. The method as claimed in claim 3 wherein said first layer forming step comprises:

reacting silane and diborane in the presence of said wafer whereby a borosilicate glass is deposited on each of said surfaces.

5. The method as claimed in claim 4 further comprising:
reacting said silane and said diborane in such proportion that said borosilicate glass contains about 17% boron by weight.

6. The method as claimed in claim 4 further comprising the step of:
carrying out said reaction until about 6000 Å of said borosilicate glass is deposited on each of said surfaces.

7. The method as claimed in claim 1 wherein:
said step of forming said layer of masking material comprises chemically depositing silicon dioxide from a vapor containing silane.

8. The method as claimed in claim 7 further comprising the step of:
annealing said second layer of masking material.

9. The method as claimed in claim 8 wherein said annealing step comprises:
heating said second layer of masking material to a temperature of about 900° C for about 30 minutes.

10. The method as claimed in claim 1 further comprising the step of:
selectively exposing portions of said two opposing surfaces which portions oppose each other.

11. The method as claimed in claim 1 wherein:
said exposing step comprises exposing said portions to a source of aluminum impurities.

12. The method as claimed in claim 1 wherein:
said heating step comprises heating said wafer to about 1300° C for about 20 hours.

13. The method as claimed in claim 1 further comprising:
selecting boron as said first impurity and selecting aluminum as said second impurity.

14. The method as claimed in claim 1 wherein:
said step of disposing said layer of masking material comprises chemically depositing silicon dioxide from a vapor containing silane.

* * * * *